US009804785B2

United States Patent
Cohen et al.

(10) Patent No.: US 9,804,785 B2
(45) Date of Patent: Oct. 31, 2017

(54) NONVOLATILE MEMORY ADAPTIVE TO HOST BOOT UP ROUTINE

(71) Applicant: SANDISK TECHNOLOGIES LLC, Plano, TX (US)

(72) Inventors: Inon Cohen, Oranit (IL); Volodymyr Ivantsiv, Graz (AT)

(73) Assignee: SANDISK TECHNOLOGIES LLC, Plano, TX (US)

( * ) Notice: Subject to any disclaimer, the term of this patent is extended or adjusted under 35 U.S.C. 154(b) by 175 days.

(21) Appl. No.: 14/493,147

(22) Filed: Sep. 22, 2014

(65) Prior Publication Data

US 2016/0085455 A1    Mar. 24, 2016

(51) Int. Cl.
| G06F 12/00 | (2006.01) |
| G06F 3/06 | (2006.01) |
| G11C 8/06 | (2006.01) |
| G11C 16/26 | (2006.01) |
| G11C 11/56 | (2006.01) |

(52) U.S. Cl.
CPC ............ *G06F 3/0611* (2013.01); *G06F 3/064* (2013.01); *G06F 3/0632* (2013.01); *G06F 3/0679* (2013.01); *G11C 8/06* (2013.01); *G11C 11/5642* (2013.01); *G11C 16/26* (2013.01); *G11C 11/5628* (2013.01); *G11C 2211/5641* (2013.01)

(58) Field of Classification Search
CPC ...... G06F 3/0611; G06F 3/0632; G06F 3/064; G06F 3/0679; G11C 11/5628; G11C 11/5642; G11C 16/26; G11C 2211/5641; G11C 8/06
See application file for complete search history.

(56) References Cited

U.S. PATENT DOCUMENTS

| 2009/0158023 A1* | 6/2009 | Kern ..................... G06F 9/4401 713/2 |
| 2010/0077194 A1 | 3/2010 | Zhao et al. |
| 2010/0095106 A1 | 4/2010 | Alexander et al. |
| 2012/0265921 A1 | 10/2012 | Post et al. |
| 2014/0160842 A1* | 6/2014 | Takafuji ............... G11C 11/5621 365/185.03 |
| 2014/0215199 A1* | 7/2014 | Ma ....................... G06F 9/4406 713/2 |

\* cited by examiner

*Primary Examiner* — Zhuo Li
(74) *Attorney, Agent, or Firm* — Foley & Lardner LLP

(57) ABSTRACT

A nonvolatile memory that stores boot data from a host learns which data is boot data by monitoring read commands received from a host during a powering up operation. Boot data is then arranged in a manner that makes subsequent reading of the boot data faster when it is accessed during a subsequent powering up operation.

20 Claims, 14 Drawing Sheets

Programming into four states represented by a 2-bit code

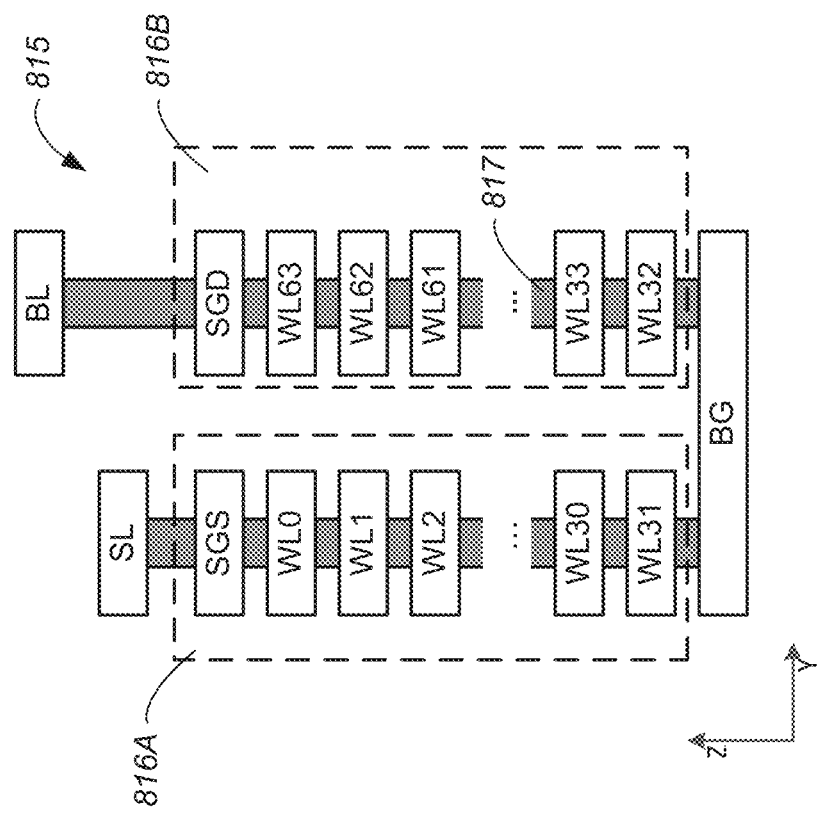
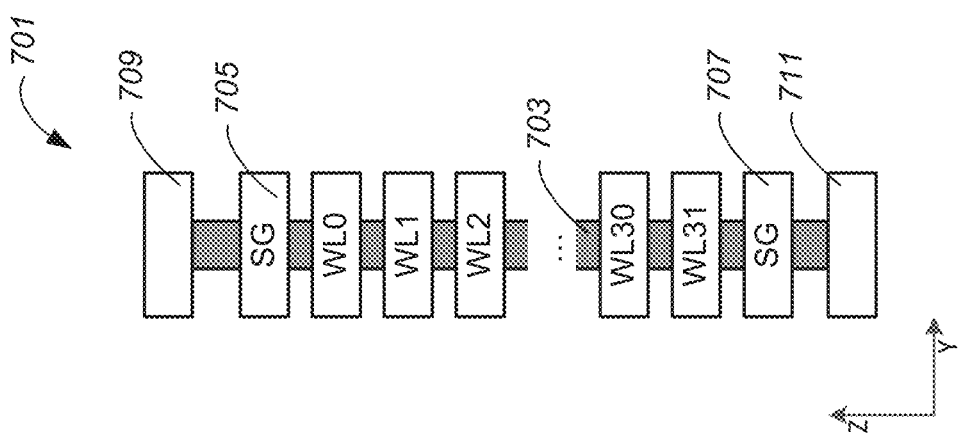

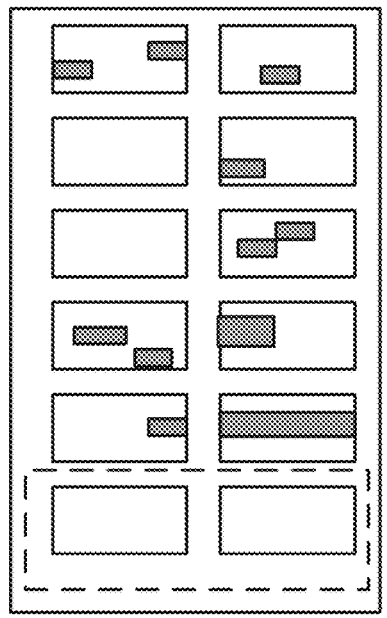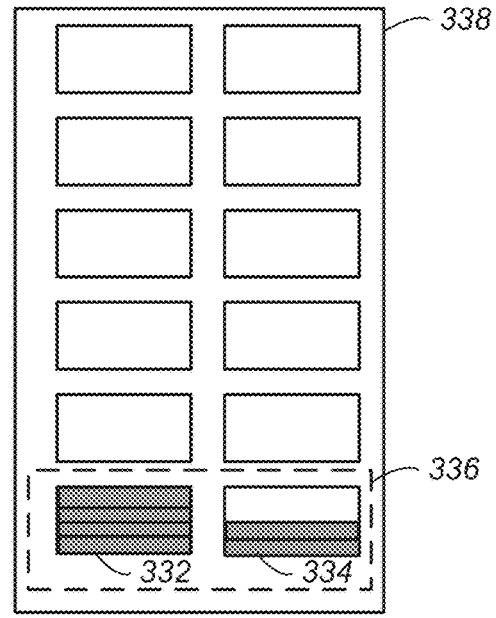
FIG. 13A          FIG. 13B
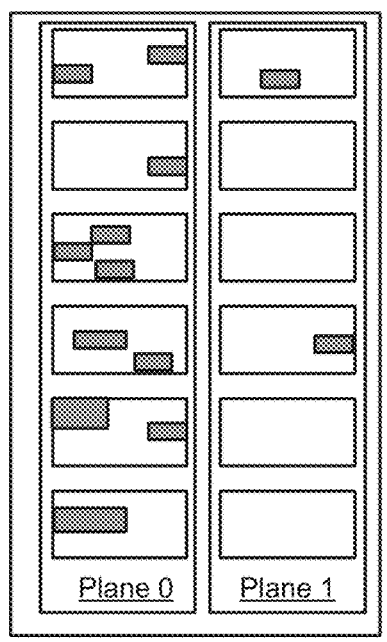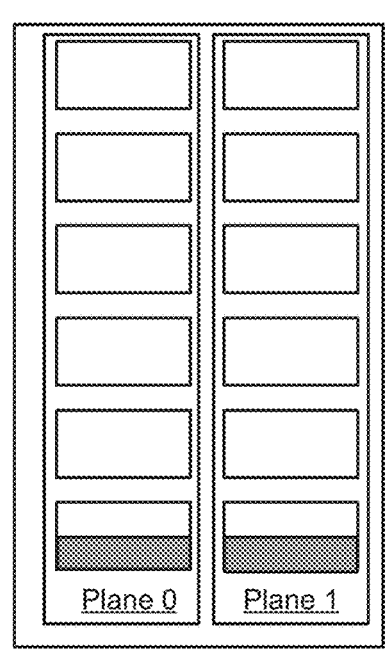
FIG. 14A          FIG. 14B

NONVOLATILE MEMORY ADAPTIVE TO HOST BOOT UP ROUTINE

BACKGROUND

This application relates to the operation of re-programmable nonvolatile memory such as semiconductor flash memory.

Solid-state memory capable of nonvolatile storage of charge, particularly in the form of EEPROM and flash EEPROM packaged as a small form factor card, has become the storage of choice in a variety of mobile and handheld devices, notably information appliances and consumer electronics products. Unlike RAM (random access memory) that is also solid-state memory, flash memory is non-volatile, and retains its stored data even after power is turned off. Also, unlike ROM (read only memory), flash memory is rewritable similar to a disk storage device.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) to be applied to the control gate before the transistor is turned "on" to permit conduction between its source and drain regions. Flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

Nonvolatile memory devices are also manufactured from memory cells with a dielectric layer for storing charge. Instead of the conductive floating gate elements described earlier, a dielectric layer is used. An ONO dielectric layer extends across the channel between source and drain diffusions. The charge for one data bit is localized in the dielectric layer adjacent to the drain, and the charge for the other data bit is localized in the dielectric layer adjacent to the source. Multi-state data storage is implemented by separately reading the binary states of the spatially separated charge storage regions within the dielectric.

Many nonvolatile memories are formed along a surface of a substrate (e.g. silicon substrate) as two dimensional (2D), or planar, memories. Other nonvolatile memories are three dimensional (3-D) memories that are monolithically formed in one or more physical levels of memory cells having active areas disposed above a substrate.

In some cases, nonvolatile memories are used to store data that is used by a host during a powering up operation. For example, a host may store operating system boot data in a nonvolatile memory and may require the boot data to be read and sent to the host during a power up operation in order to bring the host to a fully functional condition. Rapidly reading and sending such data to the host is generally desirable in order to make the host fully functional rapidly.

SUMMARY

In some memory systems, data that a host uses during a power up routine (boot data) may be stored in a manner that makes reading the data during a power up routine slower than is desirable. For example, the boot data may be fragmented so that it is dispersed throughout a large number of blocks and/or may be stored in a format (e.g. Multi Level Cell "MLC" format) that makes reading slower than an alternative format (e.g. Single Level Cell "SLC" format). A memory system may identify boot data by recording a number of read commands that are received from a host immediately after receiving power and identifying the corresponding data in the memory. After the power up routine is complete (at some suitable time, e.g. during idle period), this data may be reconfigured for faster read access. For example, fragmented data may be defragmented so that it is consolidated into a smaller number of blocks. Boot data may be moved from MLC blocks to SLC blocks. The data may be arranged in the destination blocks according to the order of read commands so that boot consolidation data can be read with a high degree of parallelism.

An example of a method of operating a nonvolatile memory includes monitoring a series of read commands received from a host during a first powering up operation to identify data stored in the nonvolatile memory that is used by the host during the first powering up operation; determining physical locations in the nonvolatile memory at which the identified data is stored; subsequently reconfiguring at least some of the identified data to provide reconfigured data with faster read access time than unreconfigured data; and subsequently, during a second powering up operation, accessing the reconfigured data so that the second powering up operation is faster than the first powering up operation.

The reconfiguring may include copying identified data from the physical locations to different physical locations. At least some of the identified data may be written at the physical locations in Multi Level Cell (MLC) format and reconfiguring may include rewriting the at least some of the identified data in Single Level Cell (SLC) format. The physical locations may be in MLC blocks that form an MLC portion of the nonvolatile memory and reconfiguring may include rewriting data in SLC blocks that form an SLC portion of the nonvolatile memory. The method may also include: during the second powering up operation, monitoring read commands and identifying additional data stored in the nonvolatile memory that is used by the host during the second powering up operation; determining additional physical locations in the nonvolatile memory at which the additional identified data is stored; subsequently reconfiguring at least some of the additional identified data to provide additional reconfigured data with faster read access time than unreconfigured additional data; and subsequently, during a third powering up operation, accessing the additional reconfigured data so that the third powering up operation is faster than the second powering up operation. A plurality of additional powering up operations may be performed, and during each of the plurality of additional powering up operations, read commands may be monitored and subsequently any newly identified data that is read by the host during a given powering up operation may be reconfigured for faster access in a subsequent powering up operation. The locations at which the identified data is stored may be distributed across a first number of blocks and the reconfiguring may include consolidating the identified data into a second number of blocks that is smaller than the first number. The order of the series of read commands from the host may be monitored and reconfiguring may include reconfiguring according to the order of the series of read commands. The series of read commands may consist of a predetermined number of read commands received from a host after the nonvolatile memory receives power, or may consists of all host read commands received within a predetermined time period after the nonvolatile memory receives power.

An example of a nonvolatile memory includes: a nonvolatile memory array; a host interface; a monitoring circuit that is configured to monitor host data read commands received through the host interface during power up operations; a data identification circuit that is configured to identify data stored in the nonvolatile memory that is addressed by the host read commands during power up operations; and a data reconfiguring circuit that is configured to reconfigure the data identified by the data identification circuit for faster read access.

The data reconfiguration circuit may include a data copying circuit that is configured to copy the data identified by the data identification circuit to physical locations that provide fast read access. The nonvolatile memory array may include Multi Level Cell (MLC) blocks and Single Level Cell (SLC) blocks and the data copying circuit may be configured to copy data from MLC blocks to SLC blocks. The data monitoring circuit may be configured to monitor host read commands during all power up operations, the data identification circuit may be configured to identify additional data stored in the nonvolatile memory that is addressed by host read commands during a given power up operation that was not identified during a prior power up operation, and the data reconfiguration circuit may be configured to reconfigure the additional data. The data reconfiguring circuit may include a data defragmenting circuit that copies fragmented data distributed across a first number of blocks into a second number of blocks that is smaller than the first number. The monitoring circuit may be configured to monitor command order in which the host read commands are received and the data reconfiguring circuit may reconfigure the identified data for fast read access in the read command order. The nonvolatile memory array may include at least two planes and the data reconfiguration circuit may be configured to copy data for parallel reading across the at least two planes.

Various aspects, advantages, features and embodiments are included in the following description of exemplary examples thereof, which description should be taken in conjunction with the accompanying drawings.

BRIEF DESCRIPTION OF THE DRAWINGS

FIG. 7 shows an example of a physical structure of a 3-D NAND string.

FIG. 8 shows an example of a physical structure of a U-shaped 3-D NAND string.

FIGS. 13A-B shows defragmentation of stored boot data.

FIGS. 14A-C shows boot data reconfigured for faster read access.

DETAILED DESCRIPTION

Memory System

Figure 1:
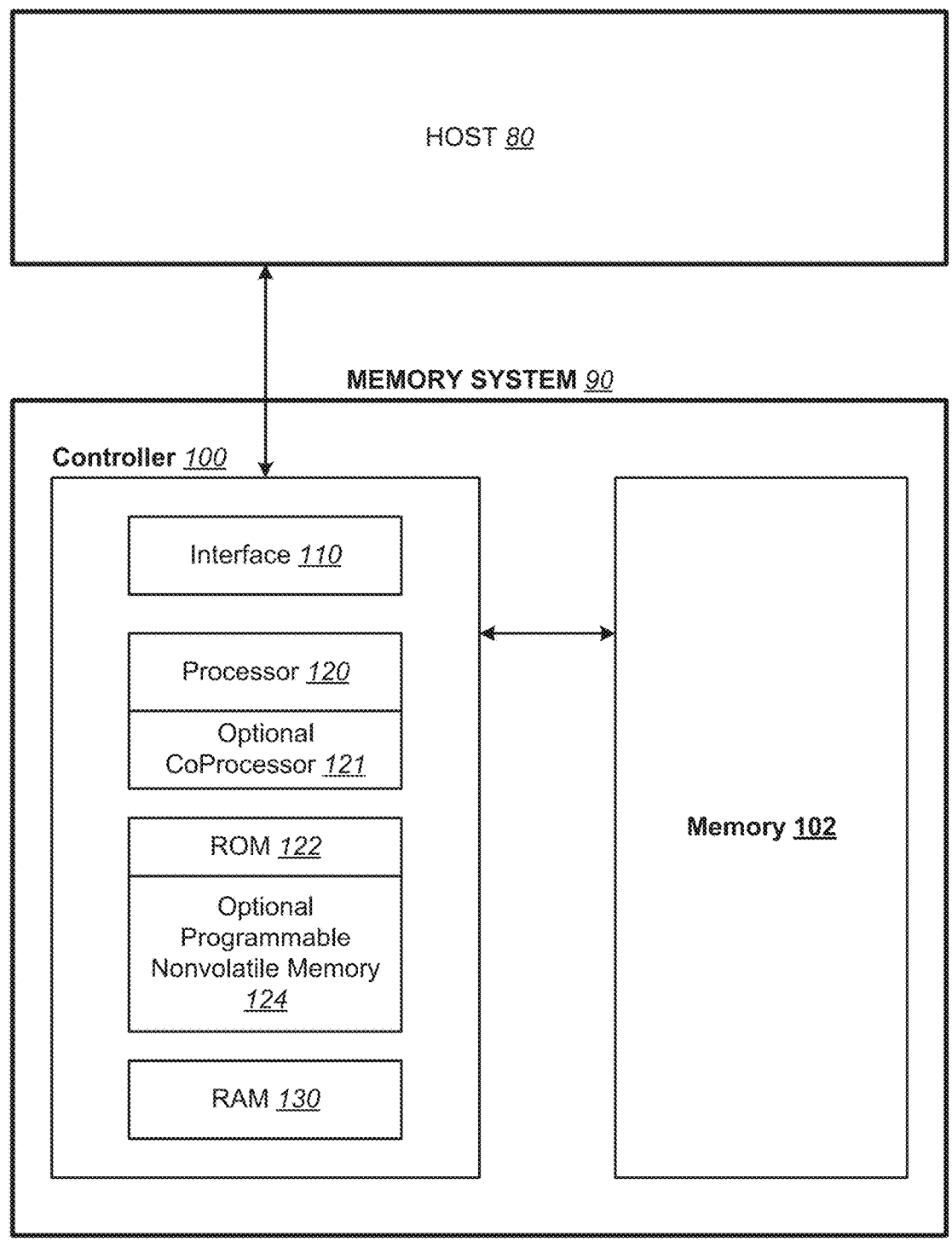
FIG. 1 illustrates schematically the main hardware components of a memory system.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

In other embodiments, types of memory other than the two dimensional and three dimensional exemplary structures described here may be used.

FIG. 1 illustrates schematically the main hardware components of a memory system suitable for implementing some of the techniques described here The memory system 90 typically operates with a host 80 through a host interface. The memory system may be in the form of a removable memory such as a memory card, or may be in the form of an embedded memory system. The memory system 90 includes a memory 102 whose operations are controlled by a controller 100. The memory 102 comprises one or more array of non-volatile memory cells distributed over one or more integrated circuit chip. The controller 100 may include interface circuits 110, a processor 120, ROM (read-only-memory) 122, RAM (random access memory) 130, programmable nonvolatile memory 124, and additional components. The controller is typically formed as an ASIC (application specific integrated circuit) and the components included in such an ASIC generally depend on the particular application. Memory systems may be used with a variety of hosts in a variety of different environments. For example, a host may be a mobile device such as a cell phone, laptop, music player (e.g. MP3 player), Global Positioning System (GPS) device, tablet computer, or the like. Such memory systems may be inactive, without power, for long periods during which they may be subject to various conditions including high temperatures, vibration, electromagnetic fields, etc. Memory systems for such hosts, whether removable or embedded, may be selected for low power consumption, high data retention, and reliability in a wide range of environmental conditions (e.g. a wide temperature range). Other hosts may be stationary. For example, servers used for internet applications may use nonvolatile memory systems for storage of data that is sent and received over the internet. Such systems may remain powered up without interruption for extended periods (e.g. a year or more) and may be frequently accessed throughout such periods. Individual blocks may be frequently written and erased so that endurance may be a major concern.

Physical Memory Structure

Figure 2:
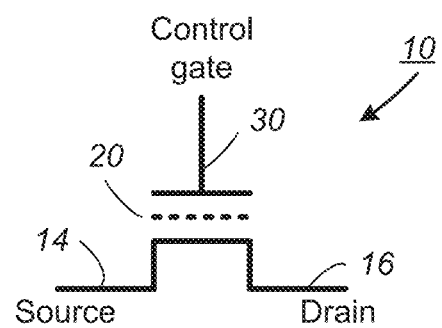
FIG. 2 illustrates schematically a non-volatile memory cell.

FIG. 2 illustrates schematically a non-volatile memory cell. The memory cell 10 can be implemented by a field-effect transistor having a charge storage unit 20, such as a floating gate or a charge trapping (dielectric) layer. The memory cell 10 also includes a source 14, a drain 16, and a control gate 30.

There are many commercially successful non-volatile solid-state memory devices being used today. These memory devices may employ different types of memory cells, each type having one or more charge storage element.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current (cell-read reference current). In one implementation the detection of the conduction current relative to a threshold current is accomplished by examining the rate the conduction current is discharging through the capacitance of the bit line.

Figure 3:
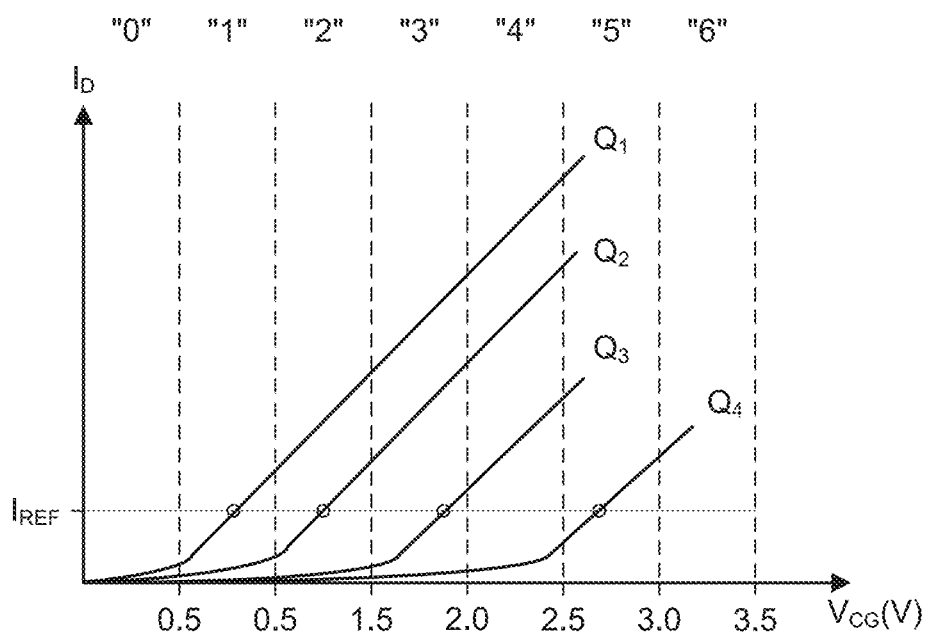
FIG. 3 illustrates the relation between the source-drain current $I_D$ and the control gate voltage $V_{CG}$ for four different charges Q1-Q4 that the floating gate may be selectively storing at any one time at fixed drain voltage.

FIG. 3 illustrates the relation between the source-drain current $I_D$ and the control gate voltage $V_{CG}$ for four different charges Q1-Q4 that the floating gate may be selectively storing at any one time. With fixed drain voltage bias, the four solid $I_D$ versus $V_{CG}$ curves represent four of seven possible charge levels that can be programmed on a floating gate of a memory cell, respectively corresponding to four possible memory states. As an example, the threshold voltage window of a population of cells may range from 0.5V to 3.5V. Seven possible programmed memory states "0", "1", "2", "3", "4", "5", "6", and an erased state (not shown) may be demarcated by partitioning the threshold window into regions in intervals of 0.5V each. For example, if a reference current, IREF of 2 µA is used as shown, then the cell programmed with Q1 may be considered to be in a memory state "1" since its curve intersects with $I_{REF}$ in the region of the threshold window demarcated by VCG=0.5V and 1.0V. Similarly, Q4 is in a memory state "5".

As can be seen from the description above, the more states a memory cell is made to store, the more finely divided is its threshold voltage window. For example, a memory device may have memory cells having a threshold voltage window that ranges from -1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

NAND Structure

Figure 4A:
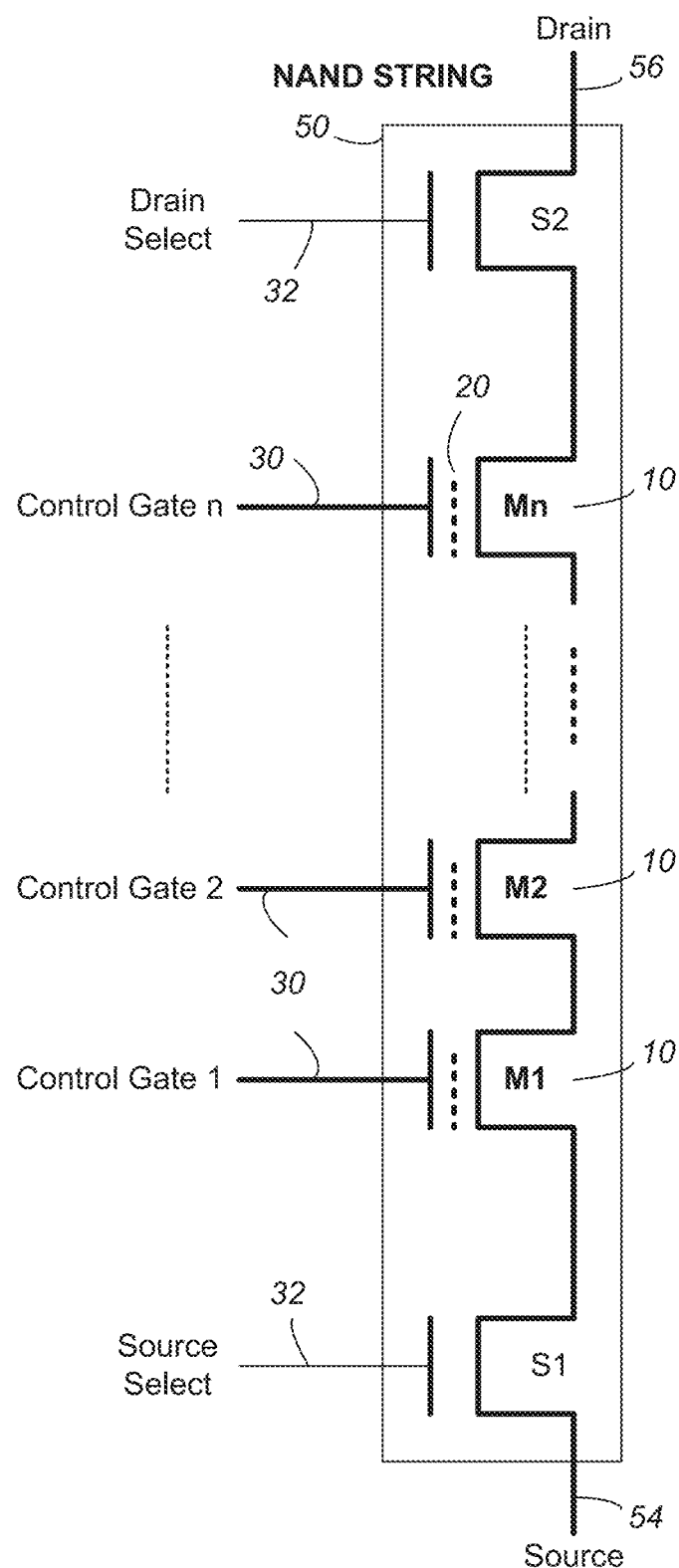
FIG. 4A illustrates schematically a string of memory cells organized into a NAND string.

FIG. 4A illustrates schematically a string of memory cells organized into a NAND string. A NAND string 50 comprises a series of memory transistors M1, M2, . . . Mn (e.g., n=4, 8, 16 or higher) daisy-chained by their sources and drains. A pair of select transistors S1, S2 controls the memory transistor chain's connection to the external world via the NAND string's source terminal 54 and drain terminal 56 respectively. In a memory array, when the source select transistor S1 is turned on, the source terminal is coupled to a source line (see FIG. 4B). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 4B, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

When an addressed memory transistor 10 within a NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path is effectively created from the source of the individual memory transistor to the source terminal 54 of the NAND string and likewise for the drain of the individual memory transistor to the drain terminal 56 of the cell.

Figure 4B:
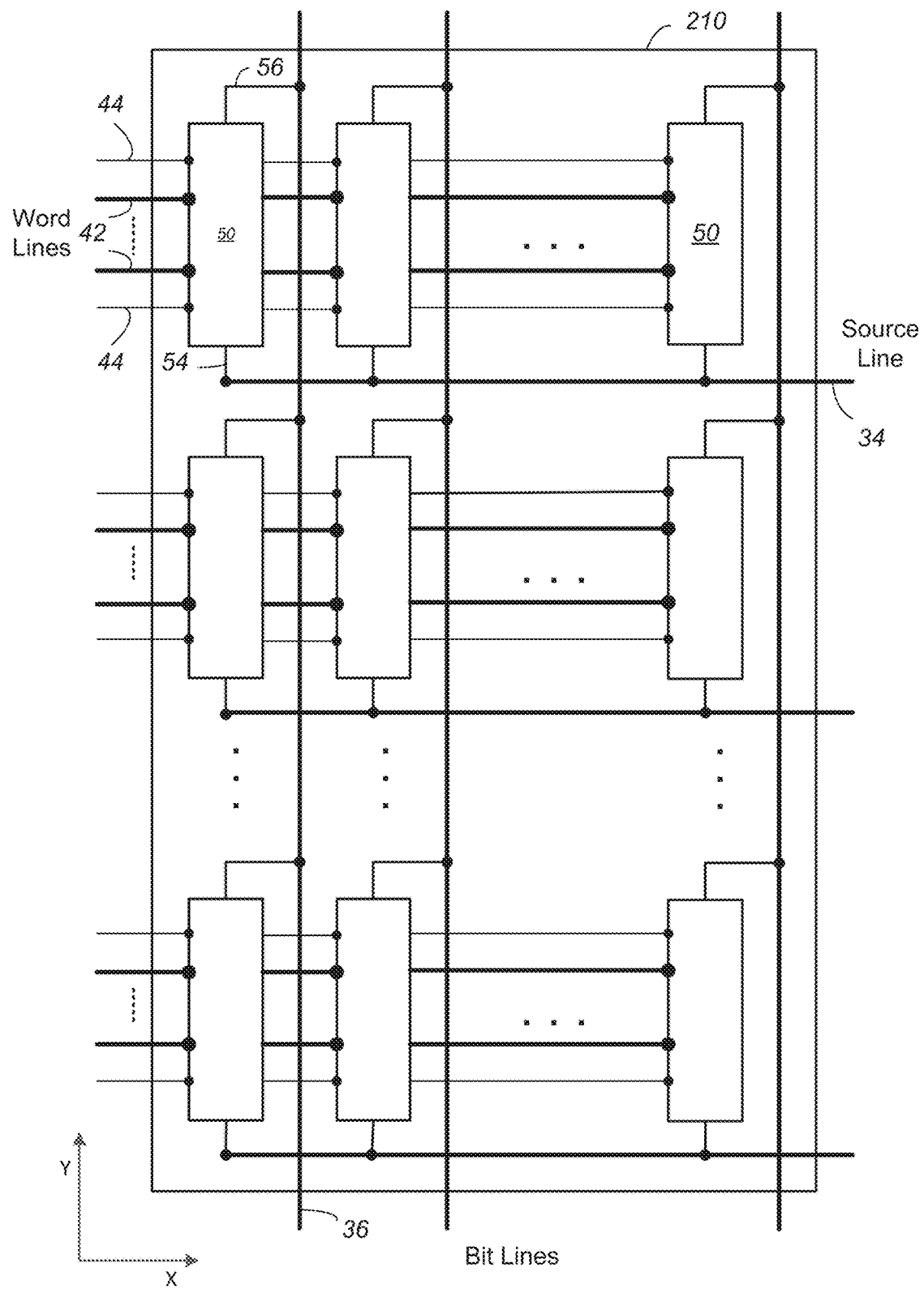
FIG. 4B illustrates an example of a NAND array 210 of memory cells, constituted from NAND strings 50 such as that shown in FIG. 4A.

FIG. 4B illustrates an example of a NAND array 210 of memory cells, constituted from NAND strings 50 such as that shown in FIG. 4A. Along each column of NAND strings, a bit line such as bit line 36 is coupled to the drain terminal 56 of each NAND string. Along each bank of NAND strings, a source line such as source line 34 is coupled to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings.

Figure 5:
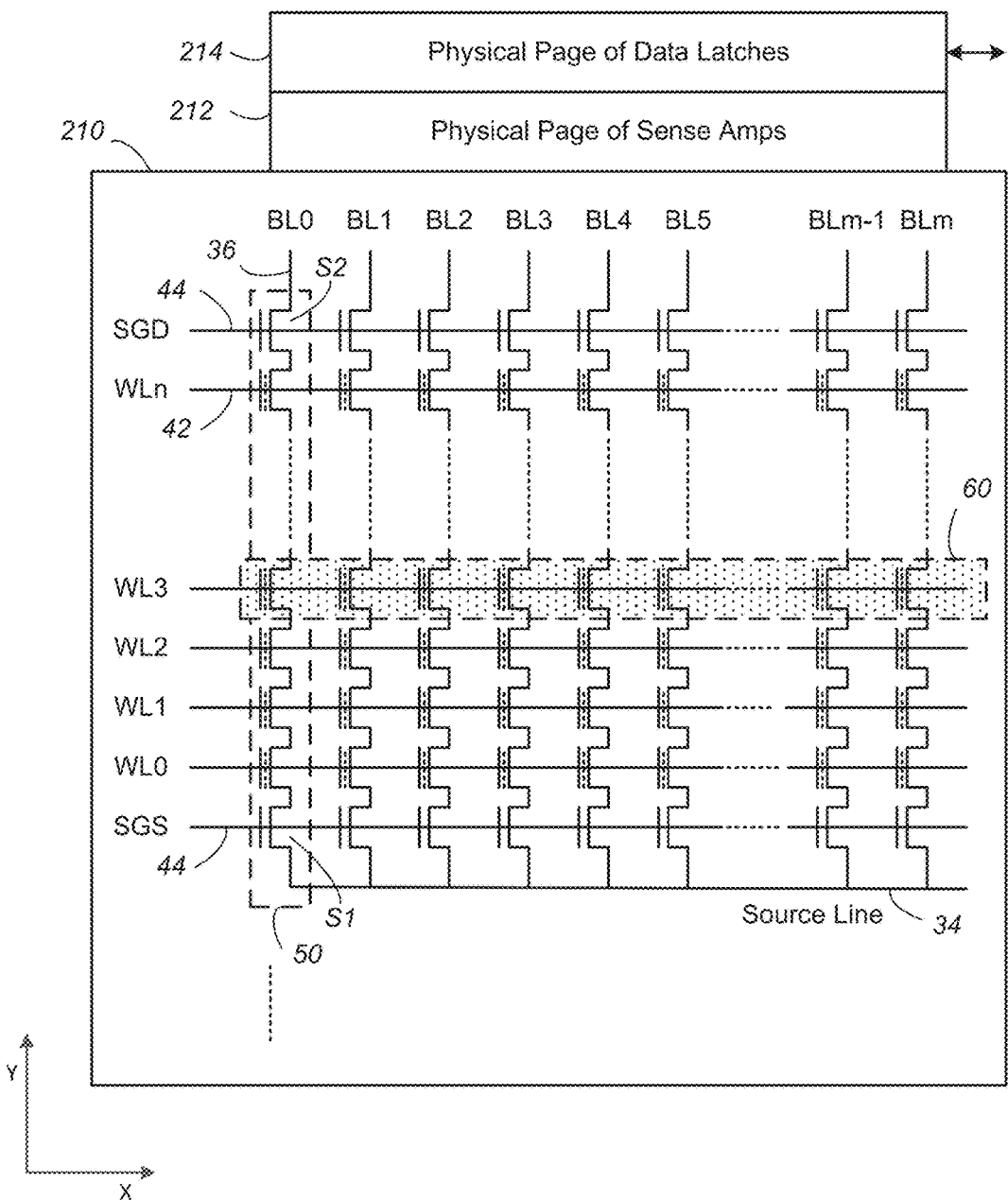
FIG. 5 illustrates a page of memory cells, organized in the NAND configuration, being sensed or programmed in parallel.

FIG. 5 illustrates a page of memory cells, organized in the NAND configuration, being sensed or programmed in parallel. FIG. 5 essentially shows a bank of NAND strings 50 in the memory array 210 of FIG. 4B, where the detail of each NAND string is shown explicitly as in FIG. 4A. A physical page, such as the page 60, is a group of memory cells enabled to be sensed or programmed in parallel. This is accomplished by a corresponding page of sense amplifiers 212. The sensed results are latched in a corresponding set of latches 214. Each sense amplifier can be coupled to a NAND string via a bit line. The page is enabled by the control gates of the cells of the page connected in common to a word line 42 and each cell accessible by a sense amplifier accessible via a bit line 36. As an example, when respectively sensing or programming the page of cells 60, a sensing voltage or a programming voltage is respectively applied to the common word line WL3 together with appropriate voltages on the bit lines.

Physical Organization of the Memory

One difference between flash memory and other of types of memory is that a flash memory cell is generally programmed from the erased state. That is the floating gate is generally first emptied of charge. Programming then adds a desired amount of charge back to the floating gate. Flash memory does not generally support removing a portion of the charge from the floating gate to go from a more programmed state to a lesser one. This means that updated data cannot overwrite existing data and is instead written to a previous unwritten location.

Furthermore erasing is to empty all the charges from the floating gate and generally takes appreciable time. For that reason, it will be cumbersome and very slow to erase cell by cell or even page by page. In practice, the array of memory cells is divided into a large number of blocks of memory cells. As is common for flash EEPROM systems, the block is the unit of erase. That is, each block contains the minimum number of memory cells that are erased together. While aggregating a large number of cells in a block to be erased in parallel will improve erase performance, a large size block also entails dealing with a larger number of update and obsolete data.

Each block is typically divided into a number of physical pages. A logical page is a unit of programming or reading that contains a number of bits equal to the number of cells in a physical page. In a memory that stores one bit per cell, one physical page stores one logical page of data. In memories that store two bits per cell, a physical page stores two logical pages. The number of logical pages stored in a physical page thus reflects the number of bits stored per cell. In one embodiment, the individual pages may be divided into segments and the segments may contain the fewest number of cells that are written at one time as a basic programming operation. One or more logical pages of data are typically stored in one row of memory cells. A page can store one or more sectors. A sector includes user data and overhead data.

All-Bit, Full-Sequence MLC Programming

Figure 6A:
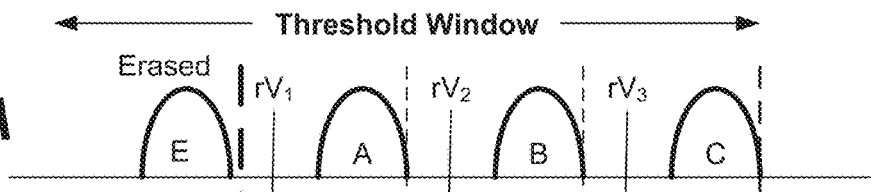
FIGS. 6A-6C illustrate an example of programming a population of memory cells.
Figure 6B:
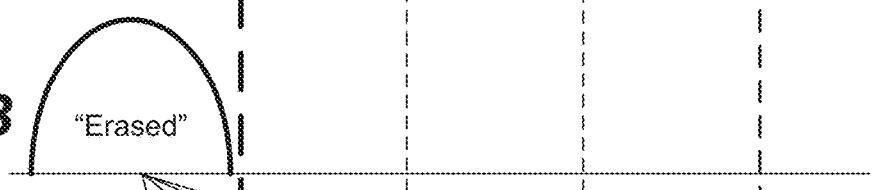
Figure 6C:
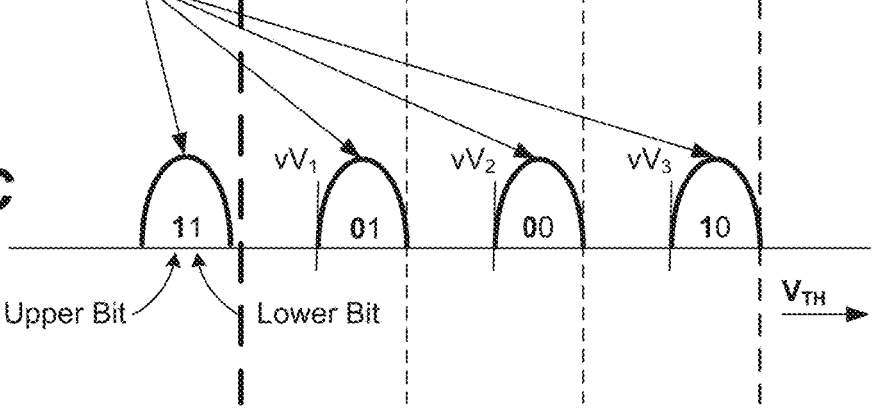

FIG. 6A-6C illustrate an example of programming a population of 4-state memory cells. FIG. 6A illustrates the population of memory cells programmable into four distinct distributions of threshold voltages respectively representing memory states "E", "A", "B" and "C". FIG. 6B illustrates the initial distribution of "erased" threshold voltages for an erased memory. FIG. 6C illustrates an example of the memory after many of the memory cells have been programmed. Essentially, a cell initially has an "erased" threshold voltage and programming will move it to a higher value into one of the three zones demarcated by verify levels $vV_1$, $vV_2$ and $vV_3$. In this way, each memory cell can be programmed to one of the three programmed states "A", "B" and "C" or remain un-programmed in the "erased" state. As the memory gets more programming, the initial distribution of the "erased" state as shown in FIG. 6B will become narrower and the erased state is represented by the "0" state.

A 2-bit code having a lower bit and an upper bit can be used to represent each of the four memory states. For example, the "E", "A", "B" and "C" states are respectively represented by "11", "01", "00" and '10". The 2-bit data may be read from the memory by sensing in "full-sequence" mode where the two bits are sensed together by sensing relative to the read demarcation threshold values $rV_1$, $rV_2$ and $rV_3$ in three sub-passes respectively.

3-D NAND Structure

An alternative arrangement to a conventional two-dimensional (2-D) NAND array is a three-dimensional (3-D) array. In contrast to 2-D NAND arrays, which are formed along a planar surface of a semiconductor wafer, 3-D arrays extend up from the wafer surface and generally include stacks, or columns, of memory cells extending upwards. Various 3-D arrangements are possible. In one arrangement a NAND string is formed vertically with one end (e.g. source) at the wafer surface and the other end (e.g. drain) on top. In another arrangement a NAND string is formed in a U-shape so that both ends of the NAND string are accessible on top, thus facilitating connections between such strings.

FIG. 7 shows a first example of a NAND string 701 that extends in a vertical direction, i.e. extending in the z-direction, perpendicular to the x-y plane of the substrate. Memory cells are formed where a vertical bit line (local bit line) 703 passes through a word line (e.g. WL0, WL1, etc.). A charge trapping layer between the local bit line and the word line stores charge, which affects the threshold voltage of the transistor formed by the word line (gate) coupled to the vertical bit line (channel) that it encircles. Such memory cells may be formed by forming stacks of word lines and then etching memory holes where memory cells are to be formed. Memory holes are then lined with a charge trapping layer and filled with a suitable local bit line/channel material (with suitable dielectric layers for isolation).

As with planar NAND strings, select gates 705, 707, are located at either end of the string to allow the NAND string to be selectively connected to, or isolated from, external elements 709, 711. Such external elements are generally conductive lines such as common source lines or bit lines that serve large numbers of NAND strings. Vertical NAND strings may be operated in a similar manner to planar NAND strings and both SLC and MLC operation is possible. While FIG. 7 shows an example of a NAND string that has 32 cells (0-31) connected in series, the number of cells in a NAND string may be any suitable number. Not all cells are shown for clarity. It will be understood that additional cells are formed where word lines 3-29 (not shown) intersect the local vertical bit line.

FIG. 8 shows a second example of a NAND string 815 that extends in a vertical direction (z-direction). In this case, NAND string 815 forms a U-shape, connecting with external elements (source line "SL" and bit line "BL") located on the top of the structure. At the bottom of NAND string 815 is a controllable gate (back gate "BG") which connects the two wings 816A, 816B of NAND string 815. A total of 64 cells are formed where word lines WL0-WL63 intersect the vertical local bit line 817 (though in other examples other numbers of cells may be provided). Select gates SGS, SGD, are located at either end of NAND string 815 to control connection/isolation of NAND string 815.

Figure 9:
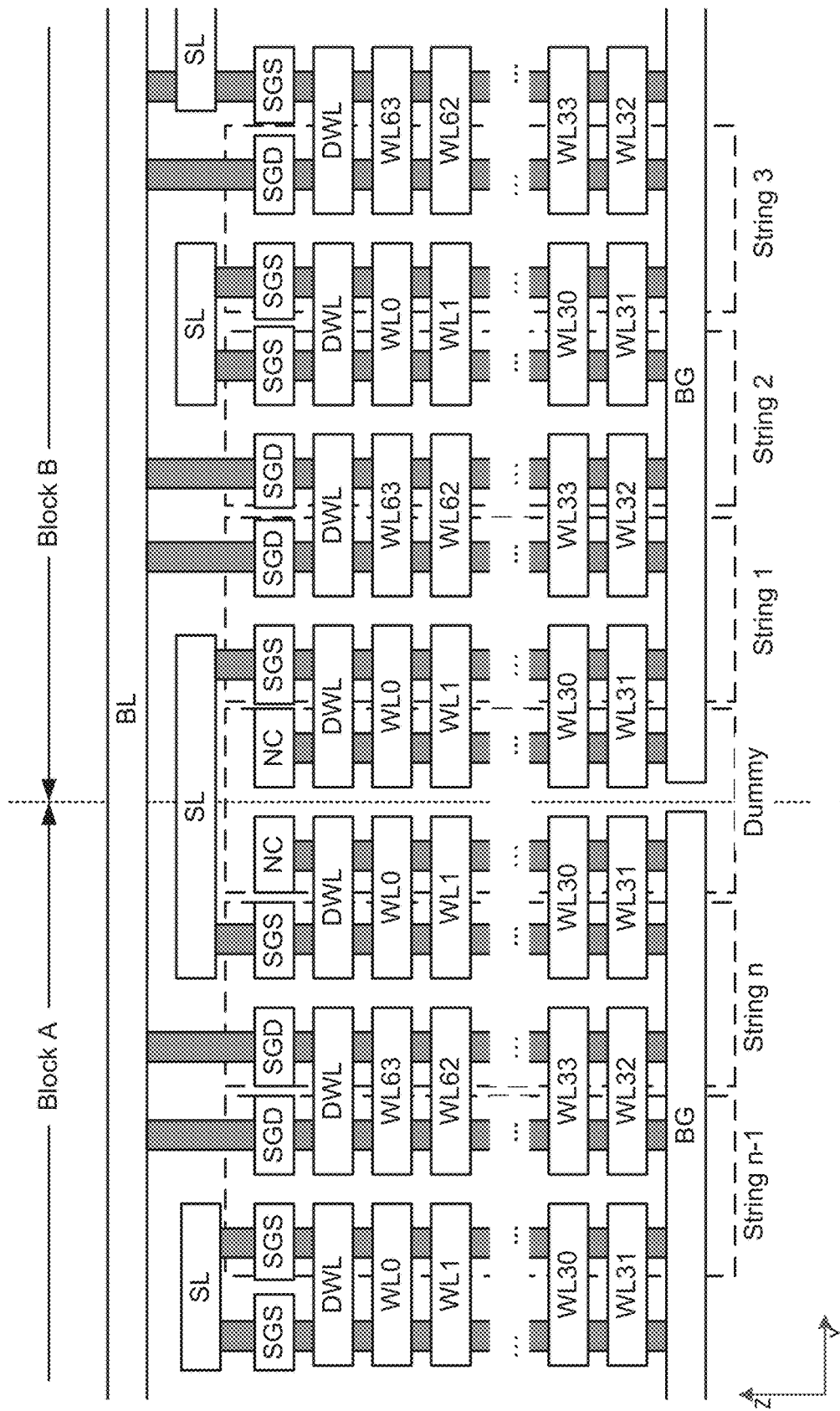
FIG. 9 shows a cross section of a 3-D NAND memory array with U-shaped NAND strings in the y-z plane.

Vertical NAND strings may be arranged to form a 3-D NAND array in various ways. FIG. 9 shows an example where multiple U-shaped NAND strings in a block are connected to a bit line. In this case, there are n strings (Sting 1-String n) in a block connected to a bit line ("BL"). The value of "n" may be any suitable number, for example, 8, 12, 16, 32, or more. Strings alternate in orientation with odd numbered strings having their source connection on the left, and even numbered strings having their source on the right. This arrangement is convenient but is not essential and other patterns are also possible.

Common source lines "SL" connect to one end of each NAND string (opposite to the end that connects to the bit line). This may be considered the source end of the NAND string, with the bit line end being considered as the drain end of the NAND string. Common source lines may be connected so that all source lines for a block may be controlled together by a peripheral circuit. Thus, NAND strings of a block extend in parallel between bit lines on one end, and common source lines on the other end.

Figure 10:
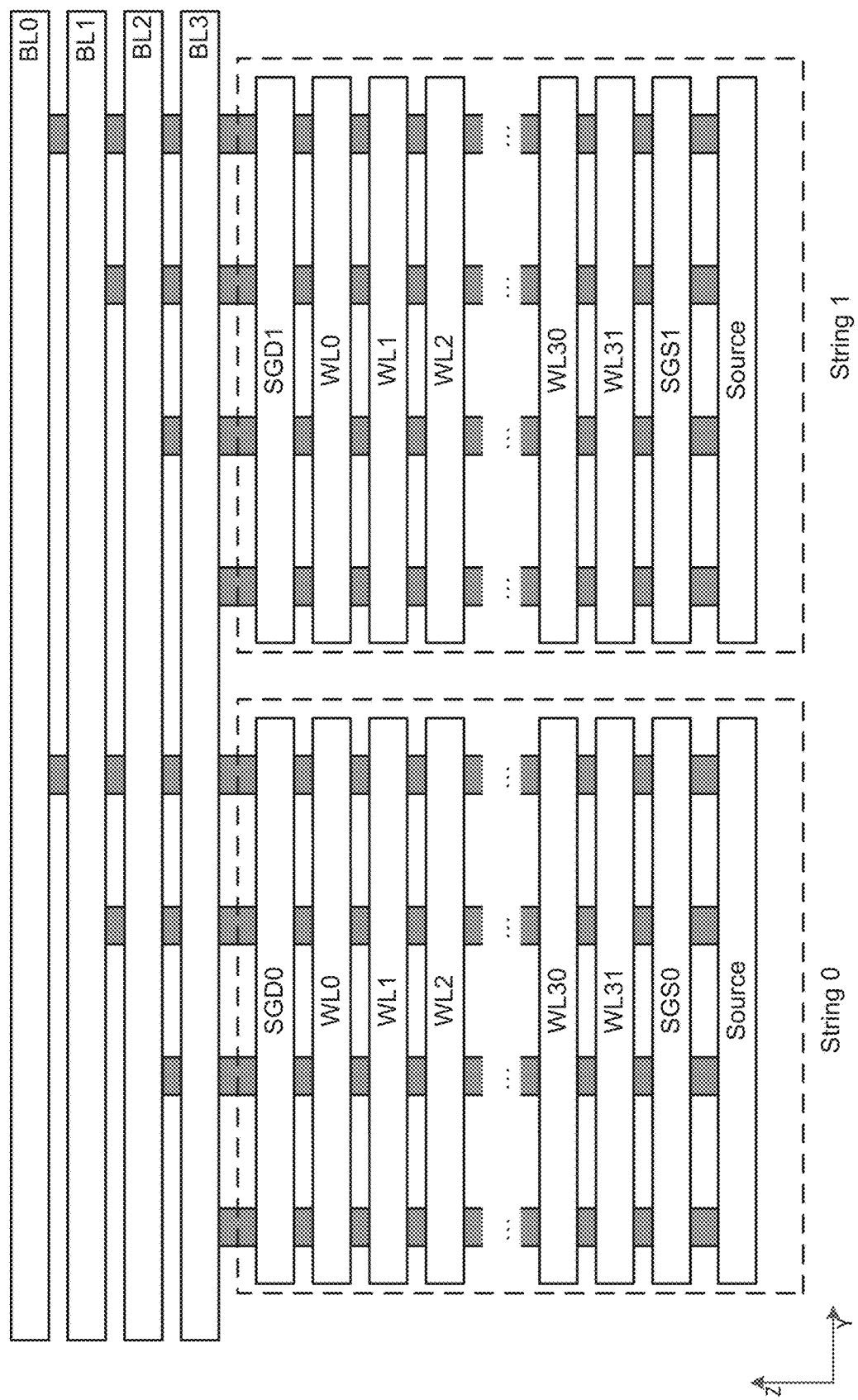
FIG. 10 shows a cross section of a 3-D NAND memory with straight NAND strings in the y-z plane.

FIG. 10 shows a memory structure in which straight vertical NAND strings extend from common source connections in or near a substrate to global bit lines (BL0-BL3) that extend over the physical levels of memory cells. Word lines in a given physical level in a block are formed from a sheet of conductive material. Memory hole structures extend down through these sheets of conductive material to form memory cells. Within a given block there are multiple NAND strings connected to a given bit line. NAND strings are grouped into sets of strings that share common select gates. Thus, for example, NAND strings that are selected by SGS0 and SGD0 may be considered a set and may be designated as String 0, while NAND strings that are selected by SGS1 and SGD1 may be considered as a set and may be designated as String 1 as shown. A block may consist of any suitable number of such sets of strings. It will be understood that the cross-section of FIG. 10 shows portions of BL0-BL3, these bit lines extend further in the y-direction. Furthermore, additional bit lines extend parallel to BL0-BL3 (e.g. at different locations along x-axis, in front of, or behind the location of the cross-section of FIG. 10). Other three dimensional memories are based on resistive elements rather than charge storage elements.

Powering Up

Some nonvolatile memory systems are used to store data that is required by a host when it powers up. Such data may include boot code and data associated with booting up the host operating system. The term "boot data" is used here to refer to any such information that a host requires in order to become fully operational. The specific boot data required by a host from a nonvolatile memory may depend on the nature of the host operating system and on what other resources the host has. For example, some boot data may be stored in ROM in the host or in some other location. Different operating systems may require different data.

A host such as a cell phone, laptop computer, tablet, or the like may read boot data from the memory when it initially receives power after a period without power. In many applications, it is desirable that the host system boot up rapidly. Therefore, it is generally desirable to return any boot data to the host rapidly. The manner in which this data is stored in the memory may affect how quickly it may be returned to the host during power up. It will be understood that the time taken to return data to the host is greater than simply the read time for the memory cells and may include time for other steps such as data transfer time, time for ECC decoding and other steps. Thus, overall read access time may include several components.

Figure 11:
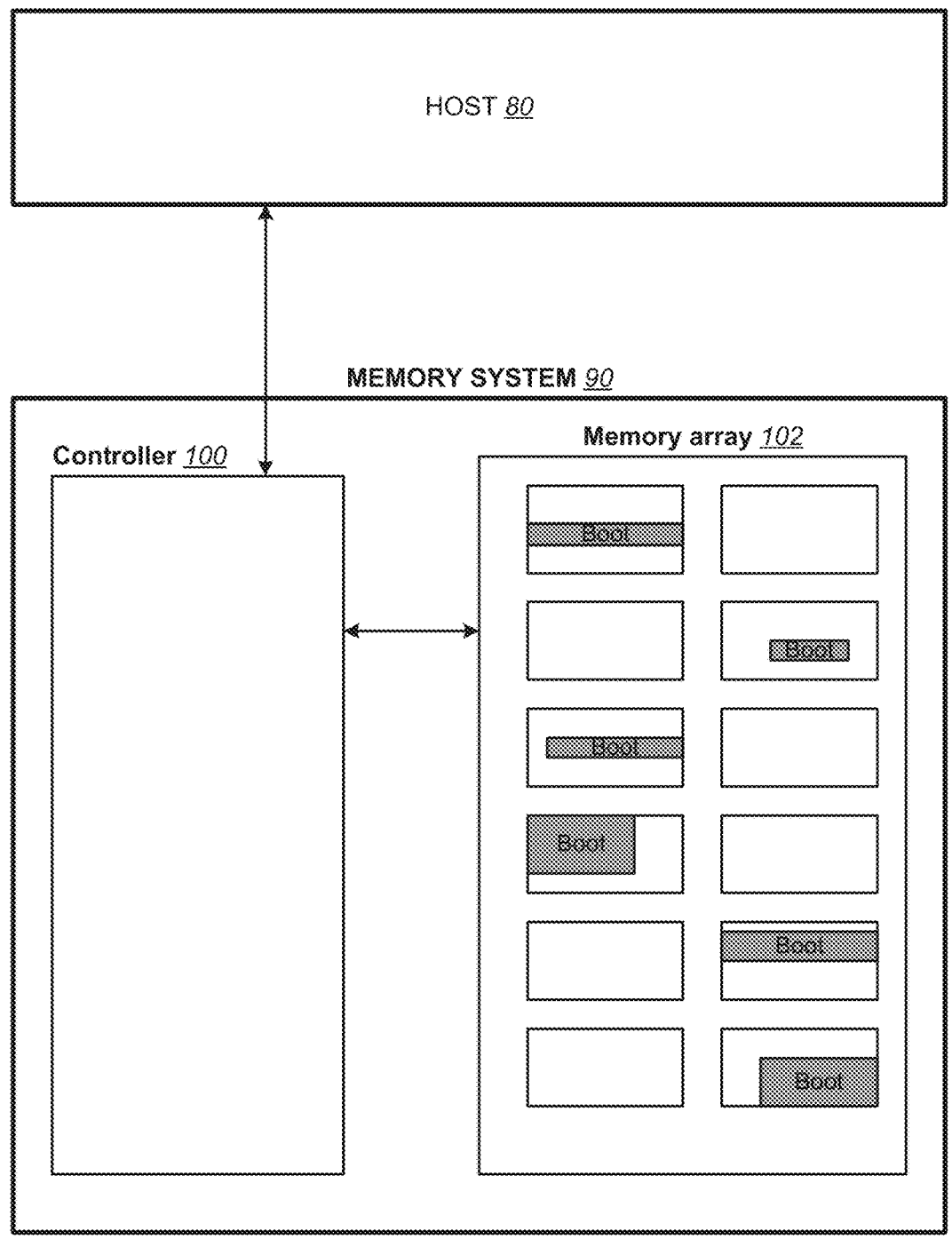
FIG. 11 shows a memory system with fragmented boot data.

FIG. 11 shows an example of a memory in which boot data (shown as shaded) is fragmented and stored across multiple blocks in a memory system 90. Data may be fragmented because when the memory controller 100 assigns physical addresses to data received from the host, the available addresses are dispersed across the memory array 102. The result of fragmentation is that read access time may be increased because a large number of separate read operations are required compared with the number that would be required if the data was not fragmented.

Other factors also affect read access time. Data that is stored in Multi Level Cell (MLC) format generally takes longer to read than data stored in Single Level Cell (SLC) format because of the larger number of threshold voltage ranges that are to be resolved. In multi-plane systems, data may be concentrated in one plane so that the data is read with low parallelism. In some memory systems, some physical locations may provide slower reads than others, or may have higher error rates which may require more ECC correction which may delay returning corrected data to the host. For example, blocks with a large number of write-erase cycles may require additional time for reading and/or correcting data. Certain physical locations within a memory array may be associated with poor data quality. For example, lower levels in some 3D memory arrays may have poor data quality which may cause reading to be slow.

Examples described here reconfigure boot data for faster access. In order to perform such reconfiguration, boot data may be identified. In some systems, the boot data may be identified by the host. For example, a host may dedicate a particular logical address range to boot code or other such data. The memory may then treat this data in an appropriate manner. However, in some cases the host does not identify boot data and a memory system may be unaware of which data the host may require during power up. The data may simply be sent by the host without using any particular address range or otherwise indicating that the data will be needed for powering up. Accordingly, the memory system may store such data in the same way it stores other data. The data may be fragmented, may be stored in MLC format, may be concentrated in a particular plane, in physical locations that tend to provide high error rates, or otherwise stored in a manner that is not conducive to high read access speeds.

Learning Host's Routine

According to an example, a memory system that does not receive an indication from a host as to what data the host needs for powering up may identify such data by monitoring host read commands that are received after the memory system first receives power. Typically, the first read commands that the host sends to the memory system after powering up are read commands to obtain data needed for booting up. For example, the host BIOS may request the boot loader, which in turn requests boot code. While the host may not identify these read commands as being associated with booting up, the memory may assume that read commands received after powering up are associated with booting up and may consider the data associated with the read commands as likely boot data. For example, a predetermined number of read commands that are received immediately after the memory receives power may be assumed to be associated with boot data. Alternatively, commands received within a predetermined period of time may be assumed to be associated with boot data.

Figure 12:
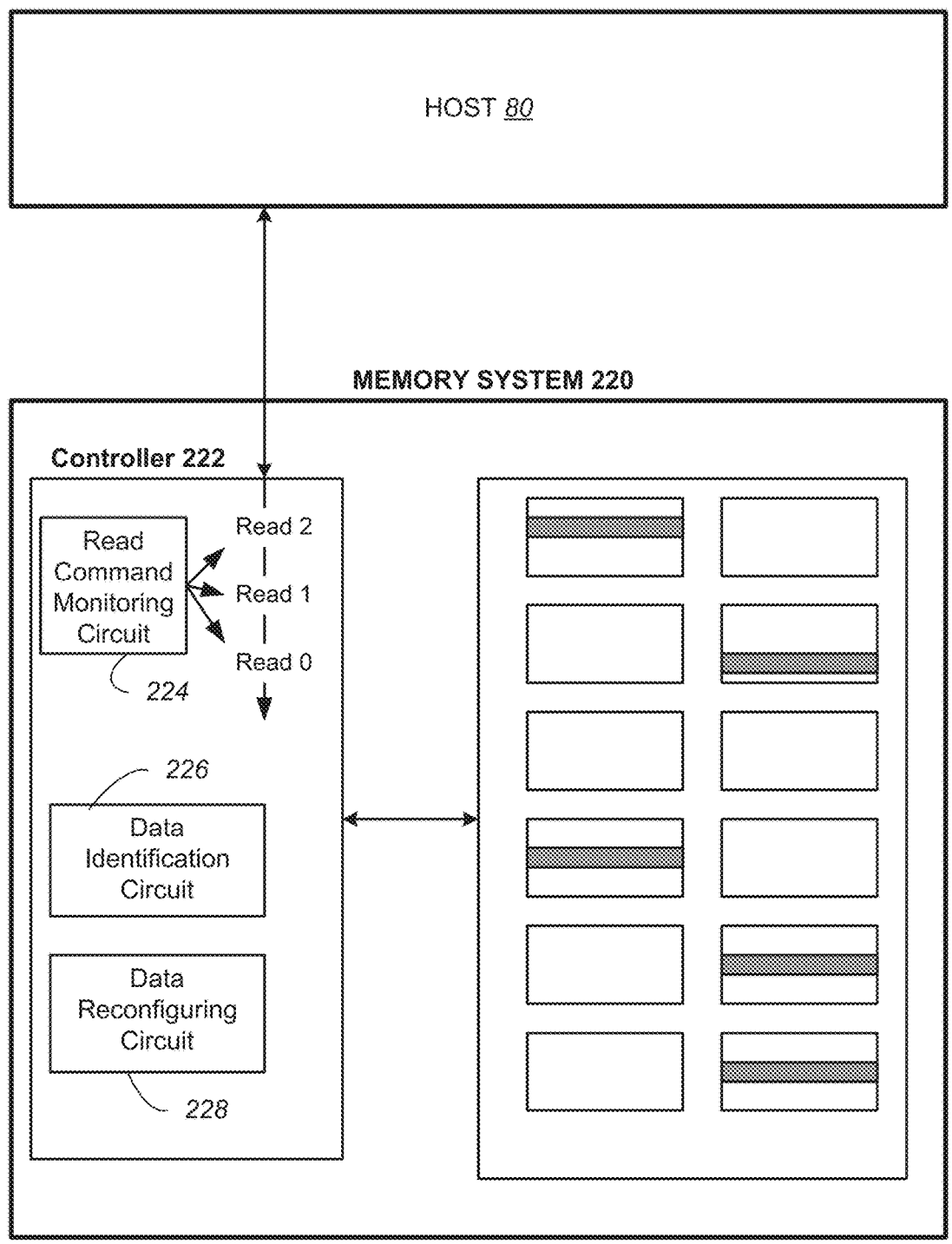
FIG. 12 shows a memory system with read command monitoring and data reconfiguring.

FIG. 12 shows an example of a memory system 220 in which a memory controller 222 includes a read command monitoring circuit 224 that monitors read commands that are received from host 80 immediately after the memory system 220 receives power. The first three read commands are shown ("Read 0" "Read 1" and "Read 2") being monitored and recorded by read command monitoring circuit 224. These read commands may be assumed to be associated with boot data. Data identification circuit 226 identifies the physical locations where this boot data is stored (i.e. data identification circuit 226 performs logical-to-physical address translation). The data reconfiguring circuit 228 then reconfigures the boot data for faster access.

In some cases it may not be known exactly which read commands are associated with boot data (i.e. the exact number of such commands is unknown, and/or the time within which such read commands are sent by the host is unknown). In some cases it is possible to initially assume a large number of such read commands are associated with boot data and to later reduce the number of such commands as memory controller 222 learns more about host read commands received during power up. The three commands shown are for illustration only and the number of read commands may be greater than three.

Boot data may be reconfigured for faster access in a number of different ways. Different examples described here apply different techniques to allow faster read access. These techniques are not mutually exclusive and may be applied in combination.

FIGS. 13A-B show an example of reconfiguration of boot data so that boot data is defragmented. FIG. 13A shows boot data (shaded) that is fragmented so that it is distributed across many blocks (eight blocks in this example). Subsequently, as shown in FIG. 13B, the boot data is defragmented so that it is consolidated into just two blocks 332, 334. Thus, reading the boot data requires accessing just two blocks 332, 334 instead of eight blocks and may be significantly faster.

Boot data may be consolidated into blocks that are the same as the blocks that previously stored the data (source blocks) or may be consolidated into blocks that are different. In some cases, using different blocks for consolidated data may provide additional read access improvement. For example, consolidated blocks may be operated as Single Level Cell (SLC) blocks while the source blocks may be Multi Level Cell (MLC) blocks. In general, reading SLC data is faster than reading MLC data. In addition, SLC data may be less susceptible to disturbance than MLC data. Alternatively, source blocks may be MLC blocks with a first number of bits per cell while consolidated blocks may be MLC blocks with a second number of bits per cell that is less than the first number. In general, read access time increases with the number of bits per cell so that this provides improved read access time. Consolidated blocks may be operated with different operating parameters including different degrees of redundancy and different physical arrangement of data in such blocks. For example, certain word lines that may tend to have high error rates and/or longer read times may be skipped or filled with dummy data in consolidated blocks. In 2D memories such as planar NAND memories this may include word lines at either ends of NAND strings, next to select lines. In 3-D memories this may include word lines in one or more physical levels of memory cells, for example the lowest physical level or levels in a block.

In some cases, consolidated blocks are chosen from suitable physical blocks that are found to have (or expected to have) fast read access times. Suitable blocks may be identified during testing, or through observing reading times during use. Suitable blocks may be identified by error rates (more errors generally require more time for correction which adds to overall read access time). For example, ECC correction may identify blocks that have low error rates. Suitable blocks may be identified from write-erase cycle counts ("hot counts") which may be predictive of read access times (blocks with higher hot counts may require more time for reading and correcting data). Reconfiguring data may include relocating data to any blocks expected to provide faster read access time.

FIG. 13B shows destination blocks 332, 334 in an SLC portion 336 of memory 338. While other blocks, including the source blocks, are MLC blocks, SLC portion 336 is operated in SLC mode.

FIGS. 14A-B show another example of reconfiguring data for faster access in a multi-plane system. FIG. 14A shows fragmented boot data in two planes, plane 0 and plane 1. The boot data is concentrated in plane 0 with much more boot data in plane 0 than plane 1. FIG. 14B shows that in addition to consolidating the data to a smaller number of blocks, boot consolidation data is more equally distributed between planes with approximately half of the boot consolidation data in each plane. In general, such a balanced arrangement allows more parallelism during reading because data may be read in both plane 0 and plane 1 in parallel throughout reading of boot data.

Figure 14C:
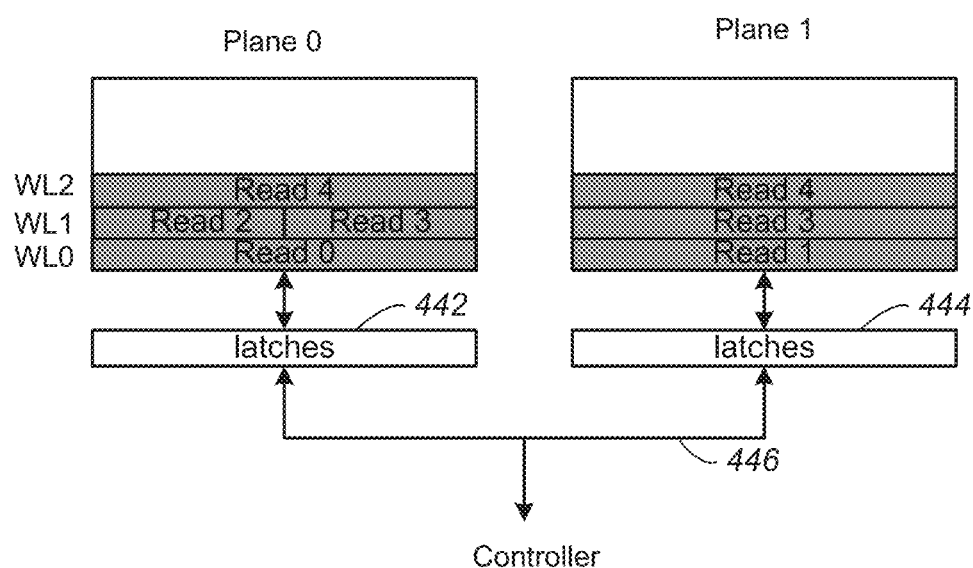

In addition to monitoring and recording which data is accessed during a power up operation, the order of such access may be monitored and recorded and this order may be used to reconfigure data for faster read access. For example, in some memory systems it may be faster to sequentially access word lines of a block. Boot data may be stored in the order in which it is expected to be read (i.e. the order of read commands of a previous power up operation). FIG. 14C shows an example of how data of FIG. 14B may be stored within consolidated blocks. Data associated with the first received read command, Read 0, is stored along the first word line in plane 0, and data associated with the second received read command, Read 1, is stored along the first word line in plane 1. The first word lines in plane 0 and plane 1 may be read in parallel so that the data is copied to data latches 442, 444 in the respective planes. The data is then transferred over memory bus 446 in series. Subsequently, data associated with third and fourth read commands, Read 2 and Read 3, stored along the second word lines may be read in parallel and copied to data latches. Subsequently, data associated with the fifth read command, Read 4, is read from the third word lines of both planes. It can be seen that such an arrangement provides faster reading than a random arrangement which could include repeated reads of one plane at a time which would not efficiently use available parallelism. Knowing the likely order of read commands may also allow data to be pre-fetched (i.e. read from memory prior to a corresponding read command being received from a host), which can further speed-up read access time. Such pre-fetched data may be stored in on-chip latches (such as data latches 442, 444) or may be cached elsewhere (e.g. In the memory controller).

Figure 15:
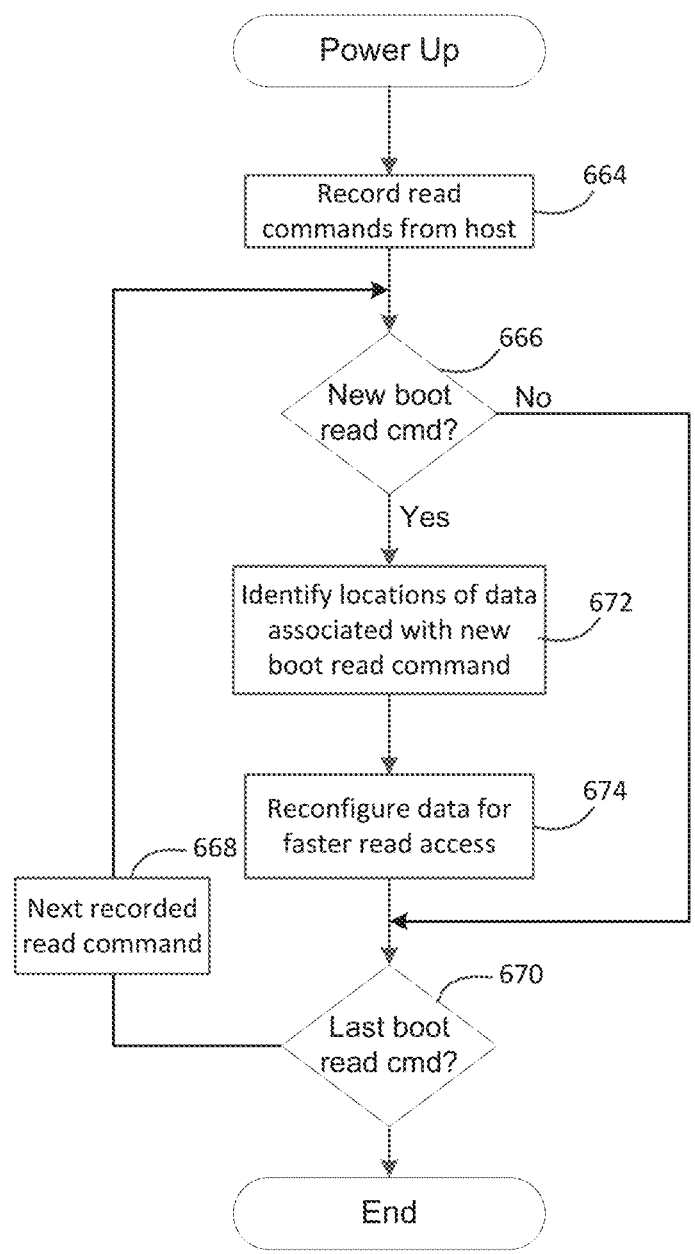
FIG. 15 illustrates an example of steps in a routine.

FIG. 15 illustrates a powering up routine in which a memory controller learns which data is boot data and reconfigures the boot data accordingly. A number of read commands from a host are recorded 664 and a determination is made as to whether the first read command is a new boot read command 666 (i.e. a read command identifying data that was not previously identified as boot data). If the first command is not a new boot read command then the routing proceeds to the next recorded read command 668 until the last recorded boot read command is reached 670. If a new boot read command is encountered 666 then the location (or locations) of data specified in the new boot read command is (are) identified 672. This data is then reconfigured for faster access 674. This may include one or more of the techniques described above.

The number of read commands to record in step 664 may be determined from multiple powering up routines. For example the number of read commands (or time for recording such read commands) may initially be large so that the probability of capturing all boot data is high. This may result in recording a significant number of read commands that are not associated with boot data. However, after two or more power up routines the lists of read commands may be compared and the common read commands may be identified. Read commands that are common from one power up routine to another may be assumed to be associated with boot data and the number of read commands to be recorded may be limited accordingly.

In general, reconfiguration of boot data does not have to occur immediately after such data is identified. Reconfiguration may be performed in the background as resources are available. While it is preferable to reconfigure data before a subsequent power up routine it may not be considered as a high priority operation and may be deferred if there are higher priority operations. In general, such reconfiguration is transparent to the host. In other cases, reconfiguration may occur in response to a host command to reconfigure boot data for faster access.

Examples described above provide ways for a memory system to learn how a particular host power up routine proceeds and to adapt the memory system accordingly to allow faster power up. In addition, where the host power up routine changes (e.g. because the host operating system is changed or upgraded) the above schemes allow the memory system to relearn any new routine and adapt accordingly. This provides flexibility to provide rapid booting up of current hosts as well as unknown hosts using unknown operating systems.

Conclusion

The foregoing detailed description has been presented for purposes of illustration and description. It is not intended to be exhaustive or to limit the attached claims. Many modifications and variations are possible in light of the above teaching.

It is claimed:

1. A method of operating a nonvolatile memory comprising:
monitoring a series of read commands received from a host during a first powering up operation to identify data stored in the nonvolatile memory that is used by the host during the first powering up operation;
determining first physical locations in the nonvolatile memory at which the identified data is stored;
subsequently, prior to a second powering up operation, consolidating at least some of the identified data from the first physical locations in the nonvolatile memory to second physical locations in the nonvolatile memory to provide the identified data with faster read access time at the second physical locations in the nonvolatile memory than at the first physical locations in the nonvolatile memory, wherein the first physical locations are fragmented locations in the nonvolatile memory that require a first number of read steps to read and the second physical locations are contiguous physical locations in the nonvolatile memory that require a second number of read steps to read, the second number being less than the first number; and
subsequently, during the second powering up operation, accessing the consolidated data at the second physical locations so that the second powering up operation is faster than the first powering up operation.

2. The method of claim 1 wherein:
the nonvolatile memory consists of flash memory,
the at least some of the identified data is written at the first physical locations in the flash memory in Multi Level Cell (MLC) format, and the consolidating includes rewriting the at least some of the identified data in Single Level Cell (SLC) format at the second physical locations in the flash memory.

3. The method of claim 2 wherein:
the nonvolatile memory is a block-erasable memory with a block as the unit of erase,
the first physical locations are in MLC blocks that form an MLC portion of the flash memory, and
consolidating includes rewriting the at least some of the identified data in SLC blocks that form an SLC portion of the flash memory.

4. The method of claim 1 further comprising:
during the second powering up operation, monitoring read commands and identifying additional data stored in the nonvolatile memory that is used by the host during the second powering up operation;
determining additional physical locations in the nonvolatile memory at which the additional identified data is stored;
subsequently consolidating at least some of the additional identified data to provide additional consolidated data with faster read access time than unconsolidated additional data; and
subsequently, during a third powering up operation, accessing the additional consolidated data so that the third powering up operation is faster than the second powering up operation.

5. The method of claim 4, further comprising:
performing a plurality of additional powering up operations, and during each of the plurality of additional powering up operations, monitoring read commands; and
subsequently consolidating any newly identified data that is read by the host during a given powering up operation for faster access in a subsequent powering up operation.

6. The method of claim 1 wherein:
the nonvolatile memory is a block-erasable memory, a block being a minimum unit of erase, the first physical locations are distributed across a first number of blocks in the nonvolatile memory, and
consolidating includes consolidating the identified data into a second number of blocks in the nonvolatile memory that is smaller than the first number.

7. The method of claim 1 further comprising monitoring the order of the series of read commands from the host, and wherein the consolidating includes reconfiguring the identified data according to the order of the series of read commands.

8. The method of claim 1 wherein the series of read commands consists of a predetermined number of read commands received from a host after the nonvolatile memory receives power, or consists of all host read commands received within a predetermined time period after the nonvolatile memory receives power.

9. A nonvolatile memory comprising:
a flash memory array;
a host interface;
a monitoring circuit that is configured to monitor host data read commands received through the host interface during power up operations;
a data identification circuit that is configured to identify data stored in the nonvolatile memory that is addressed by the host read commands during power up operations; and
a data reconfiguring circuit that is configured to consolidate the data identified by the data identification circuit from a first plurality of physical locations in the flash memory to a second plurality of physical locations in the flash memory for faster read access during subsequent power up operations, wherein the first plurality of physical locations are fragmented locations in the flash memory that require a first number of read steps to read and the second plurality of physical locations are contiguous physical locations in the flash memory that require a second number of read steps to read, the second number being less than the first number.

10. The nonvolatile memory of claim 9 wherein the data reconfiguration circuit is configured to consolidate the data in response to a host command to reconfigure boot data for faster access.

11. The nonvolatile memory of claim 9 wherein:
the flash memory array is a block-erasable memory array that includes Multi Level Cell (MLC) blocks and Single Level Cell (SLC) blocks; and
the data reconfiguring circuit is configured to copy data from MLC blocks to SLC blocks.

12. The nonvolatile memory of claim 9 wherein:
the monitoring circuit is configured to monitor host read commands during all power up operations,
the data identification circuit is configured to identify additional data stored in the flash memory that is addressed by host data read commands during a given power up operation that was not identified during a prior power up operation, and
the data reconfiguring circuit is configured to consolidate the additional data with previously consolidated data.

13. The nonvolatile memory of claim 9 wherein the data reconfiguring circuit includes a data defragmenting circuit that copies fragmented data distributed across a first number of blocks into a second number of blocks that is smaller than the first number.

14. The nonvolatile memory of claim 9 wherein:
the monitoring circuit is configured to monitor command order in which the host data read commands are received; and
the data reconfiguring circuit reconfigures the identified data for fast read access in the read command order.

15. The nonvolatile memory of claim 9 wherein:
the flash memory array comprises at least two planes; and
the data reconfiguring circuit is configured to copy data for parallel reading across the at least two planes.

16. A method of operating a flash memory comprising:
monitoring a series of read commands received from a host during a powering up operation to identify boot data stored in the flash memory that is used by the host during the powering up operation;
determining physical locations in the flash memory at which the boot data is stored; and
subsequently reconfiguring at least some of the boot data to provide reconfigured boot data with faster read access time than unreconfigured boot data, the reconfiguring comprising relocating the at least some of the boot data from one or more Multi Level Cell (MLC) blocks in the flash memory to one or more Single Level Cell (SLC) blocks in the flash memory, wherein the physical locations at which the unreconfigured boot data is stored are fragmented locations that require a first number of read steps to read and the physical locations at which the reconfigured boot data is stored are contiguous physical locations that require a second number of read steps to read, the second number being less than the first number.

17. The method of claim 16 wherein the reconfiguring further comprises relocating the at least some of the boot data from blocks with higher read access times to blocks with lower read access times.

18. The method of claim 16 wherein the reconfiguring further comprises relocating the at least some of the boot data from blocks with higher error rates to blocks with lower error rates.

19. The method of claim 16 wherein the reconfiguring further comprises relocating the at least some of the boot data to equalize the amount of boot data stored in two or more planes in the flash memory.

20. The method of claim 16 wherein the reconfiguring is performed as one or more background operations after the powering up operation is complete.

* * * * *